United States Patent [19]

Orisaka et al.

[11] Patent Number: 5,468,685
[45] Date of Patent: Nov. 21, 1995

[54] METHOD FOR PRODUCING A SEMICONDUCTOR INTEGRATED CIRCUIT

[75] Inventors: Shinji Orisaka; Minoru Noda, both of Itami, Japan

[73] Assignee: Mitsubishi Denki Kabushiki Kaisha, Tokyo, Japan

[21] Appl. No.: 329,908

[22] Filed: Oct. 27, 1994

Related U.S. Application Data

[62] Division of Ser. No. 35,263, Mar. 22, 1993.

[30] Foreign Application Priority Data

Mar. 31, 1992 [JP] Japan .................................. 4-109210

[51] Int. Cl.$^6$ .............................................. H01L 21/311
[52] U.S. Cl. .................... 437/228; 437/195; 437/238; 156/657.1
[58] Field of Search ................................... 437/195, 225, 437/228, 236, 238; 156/656, 657, 665, 654.1, 655.1, 657.1

[56] References Cited

U.S. PATENT DOCUMENTS

| 4,521,236 | 6/1985 | Yamamoto et al. | 65/31 |
| 4,649,228 | 3/1987 | Suzuki | 174/36 |
| 5,072,262 | 12/1991 | Uekita et al. | 251/643 |
| 5,393,712 | 2/1995 | Rostoker | 437/238 |

FOREIGN PATENT DOCUMENTS

| 0045593 | 7/1981 | European Pat. Off. . |
| 0234896 | 2/1987 | European Pat. Off. . |
| 0333132 | 9/1989 | European Pat. Off. . |
| 61-268043 | 11/1986 | Japan . |
| 63-208248 | 8/1988 | Japan . |
| 2151032 | 6/1990 | Japan . |
| 2206120 | 8/1990 | Japan . |

OTHER PUBLICATIONS

Inoue et al, "An Rh/Au/Rh Rigid Air–Bridge Interconnection Technique For Ultra–High Speed GaAs LSIs", 12th Annual GaAs IC Symposium Oct. 7–10, 1990, IEEE Technical Digest 1990, pp. 253–256.
Parillo, "VLSI Process Integration", VLSI Technology, pp. 445 and 475, 1983 McGraw-Hill, (Sze, S. M., Editor).

Primary Examiner—T. N. Quach
Attorney, Agent, or Firm—Leydig, Voit & Mayer

[57] ABSTRACT

A semiconductor integrated circuit includes an interlayer insulating film in which vacancies are evenly scattered. In this structure, the effective dielectric constant of the insulating film is reduced so that capacitance between upper and lower wirings and capacitance between adjacent wirings are reduced, resulting in a high speed semiconductor device. In production, a main material of the insulating film mixed with particles of a different material is applied to a surface of a wafer where the insulating film is to be formed. Then, the main material is solidified and the particles are selectively etched with an etchant that etches the particles but does not etch the main material, resulting in an insulating film in which vacancies are uniformly distributed. In this way, an insulating film having a low effective dielectric constant is formed in a simple process, resulting in a high speed semiconductor device having a small capacitance between wirings.

5 Claims, 7 Drawing Sheets

METHOD FOR PRODUCING A SEMICONDUCTOR INTEGRATED CIRCUIT

This disclosure is a division of application Ser. No. 08/035,263, filed Mar. 22, 1993.

FIELD OF THE INVENTION

The present invention relates to a semiconductor integrated circuit including interlayer insulating films that reduce capacitance between wirings and increase operating speed. The present invention also relates to a method for producing the semiconductor integrated circuit.

BACKGROUND OF THE INVENTION

FIG. 5 is a cross-sectional view showing a multilayer interconnection utilizing insulating films of a prior art semiconductor integrated circuit. In FIG. 5, reference numeral 100 designates a semiconductor substrate. A first insulating film 101 is disposed on the substrate 100 and a lower wiring 102 is disposed on the first insulating film 101. A second insulating film 103 is disposed on the first insulating film 101 and the lower wiring 102. An upper wiring 104 is disposed on the second insulating film 103.

A method of making the structure of FIG. 5 is illustrated in FIGS. 7(a)–7(d). Initially, as shown in FIG. 7(a), the first insulating film 101 is dispositied on a surface of the substrate 100 on which a semiconductor element is present. Preferably, the insulating film 101 is deposited by chemical vapor deposition (CVD). Then, a contact hole (not shown) is formed through the first insulating film 101 to connect the semiconductor element on the substrate to the lower wiring. Then, a metal film is deposited on the insulating film 101 by vapor deposition or the like and patterned as shown in FIG. 7(b), resulting in the lower wiring 102. Thereafter, as shown in FIG. 7(c), the second insulating film 103 is deposited on the entire surface of the wafer to bury the lower wiring 102. Preferably, the insulating film 103 is deposited by CVD. Then, a contact hole (not shown) is formed through the second insulating film 103 to connect the upper wiring to the lower wiring or the semiconductor element on the substrate. Then, as shown in FIG. 7(d), a metal film is deposited on the insulating film 103 by vapor deposition or the like and patterned to form the upper wiring 104.

In this structure, the first insulating film 101 electrically separates the substrate 100 from the lower wiring 102 and the second insulating film 103 electrically separates the lower wiring 102 from the upper wiring 104.

FIG. 6 is a cross-sectional view showing an air-bridge interconnection of a prior art semiconductor integrated circuit. In FIG. 6, an upper wiring 201 is supported by pillars 202 and disposed on the substrate 200. Reference numeral 203 designates air gaps between the substrate 200 and the upper wiring 201.

A method of making the structure of FIG. 6 is illustrated in FIGS. 8(a)–8(d). Initially, as shown in FIG. 8(a), a photoresist 204 is deposited on the surface of the substrate 200 on which a semiconductor element is present. Then, as shown in FIG. 8(b), the photoresist 204 is patterned to form apertures 205 at positions where the pillars of the upper wiring are to be formed. Then, as shown in FIG. 8(c), a metal film 206 is deposited on the entire surface of the wafer by vapor deposition or the like and patterned to form the upper wiring 201 and the support-pillars 202. Thereafter, as shown in FIG. 8(d), the photoresist 204 is removed to form air gaps 203 between the upper wiring 201 and the substrate 200.

In the structure of FIG. 6, the air gaps 203 electrically separate the substrate 200 or a lower wiring (not shown) from the upper wiring 201.

In the semiconductor integrated circuit including the multilayer interconnection shown in FIG. 5, the interlayer insulating film has a dielectric constant of its own and the dielectric constant is usually larger than the dielectric constant of air, no matter whether the insulating film is organic or inorganic. In this case, the capacitance between the upper and lower wirings 102 and 104 shown in FIG. 5 and the capacitance between adjacent wirings 102 and 102' shown in FIG. 9 are larger than those in the case where the wirings are separated by air. Therefore, the operating speed of the circuit is determined by the capacitance between the wirings, which makes an increase in the operating speed difficult.

In the air-bridge structure of FIG. 6, the pillars 202 supporting the upper wiring 201 are required to form the air gaps 203 between the upper wiring and a lower wiring (not shown). In case of multilayer interconnection, the pillars should be electrically separated from lower wirings except for an uppermost wiring, so that the interconnection structure is complicated, resulting in difficulty in the production process.

SUMMARY OF THE INVENTION

An object of the present invention is to provide a semiconductor integrated circuit including an interlayer insulation structure that further reduces interlayer capacitance as compared with the case of using the conventional interlayer insulating film and that is produced in easier process as compared with the case of using the air-bridge.

Another object of the present invention is to provide a production method for such a semiconductor integrated circuit.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a semiconductor integrated circuit includes vacancies or bubbles evenly scattered in an interlayer insulating film. Therefore, the effective dielectric constant of the insulating film is reduced, whereby capacitance between upper and lower wirings and capacitance between adjacent wirings are reduced, resulting in a high speed semiconductor device.

According to another aspect of the present invention, a main material of an insulating film, in which particles comprising a different material from the main material, is applied to a surface of a wafer where the insulating film is to be formed. Then, the main material is solidified and the particles are selectively etched with an etchant that etches the particles but does not etch the main material to form the insulating film in which vacancies are evenly scattered. Therefore, an insulating film having a low effective dielectric constant is formed in a simple process, resulting in a high speed semiconductor device having a small capacitance between wirings.

DETAILED DESCRIPTION OF THE PREFERRED EMBODIMENTS

Figure 1:
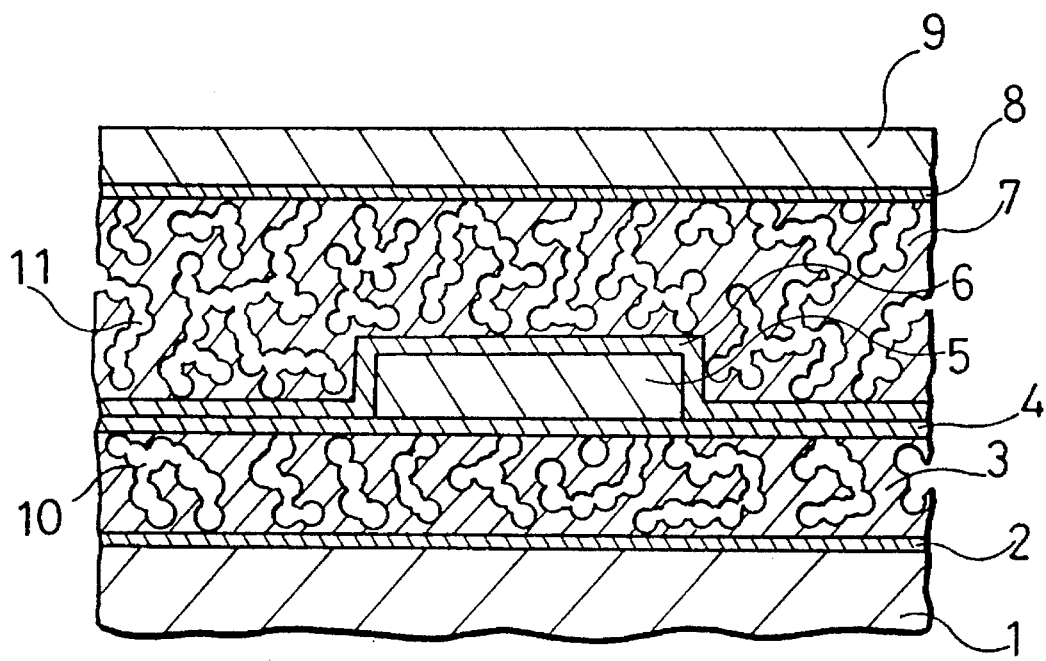
FIG. 1 is a cross-sectional view illustrating a multilayer interconnection of a semiconductor integrated circuit in accordance with a first embodiment of the present invention.

FIG. 1 is a cross-sectional view illustrating a part of a semiconductor integrated circuit in accordance with a first embodiment of the present invention. In FIG. 1, reference numeral 1 designates a semiconductor substrate. A first insulating film as a cap film (hereinafter referred to as a first cap film) 2 is disposed on the substrate 1. A first interlayer insulating film 3 is disposed on the first cap film 2. A second insulating film as a cap film (hereinafter referred to as a second cap film) 4 is disposed on the first interlayer insulating film 3. A lower wiring 5 is disposed on the second cap film 4. A third insulating film as a cap film (hereinafter referred to as a third cap film) 6 is disposed on the lower wiring 5 and the second cap film 4. A second interlayer insulating film 7 is disposed on the third cap film 6. A fourth insulating film as a cap film (hereinafter referred to a fourth cap film) 8 is disposed on the second interlayer insulating film 7. An upper wiring 9 is disposed on the fourth cap film 8. Vacancies 10 and 11 are scattered evenly in the first interlayer insulating film 3 and the second interlayer insulating film 7, respectively.

A method for producing the structure of FIG. 1 is illustrated in FIGS. 2(a)–2(e). In these figures, the same reference numerals as in FIG. 1 designate the same or corresponding parts. Reference numeral 15 designates particles mixed into a material of the first interlayer insulating film 3. Each particle 15 has a diameter of submicron order and comprises a material which is etched by an etchant that does not etch the material of the interlayer insulating film 3.

Figure 2A:
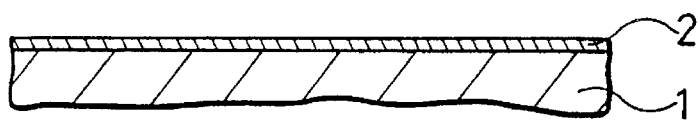
FIGS. 2(a)–2(e) are cross-sectional views of steps in a method for producing the structure of FIG. 1.

Initially, as illustrated in FIG. 2(a), a cap film 2 comprising $SiO_x$, $SiN_x$, or $SiO_xN_y$ and having a thickness of 0.1 micron or less is formed on the entire surface of the substrate 1 on which a semiconductor element is present. Preferably, the cap film 2 is formed by CVD or sputtering.

Figure 2B:
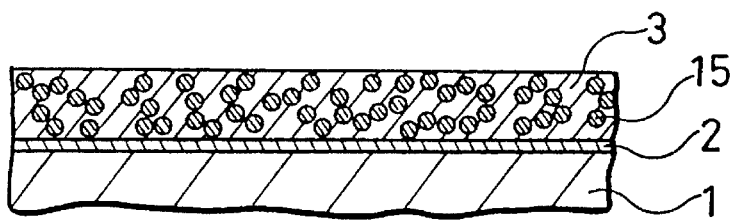

Then, as illustrated in FIG. 2(b), an $SiO_2$ (silicon dioxide) series vitreous material, which vitrifies at a low temperature and includes Al particles 15 each having a submicron diameter, is deposited on the cap film 2. Then, the vitreous material is solidified by evaporating a solvent at about 200° C. to form the insulating film 3. At this time, a part of the vitreous material may be vitrified at about 400° C.

Figure 2C:
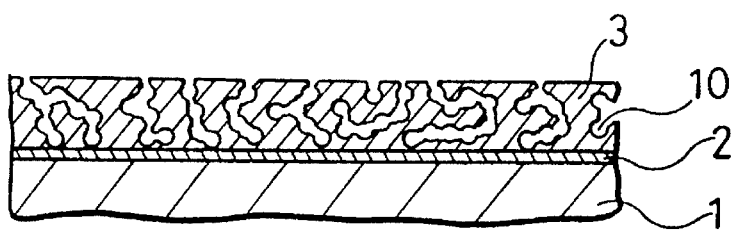

Subsequently, an alkaline etchant that selectively etches only Al, such as NaOH or KOH, penetrates through the insulating film 3 to remove the Al particles 15 as shown in FIG. 2(c), resulting in vacancies 10 in the insulating film 3.

In this embodiment, the cap film 2 on the substrate 1 serves as an etching stopper during the etching process, so that electrodes and the like of the semiconductor element formed on the substrate are not etched away by the etchant.

After the etching, the wafer is heated up to 400° to 500° C. to harden the insulating film 3. This temperature must be lower than the temperature at which performance of the semiconductor device deteriorates.

Figure 2D:
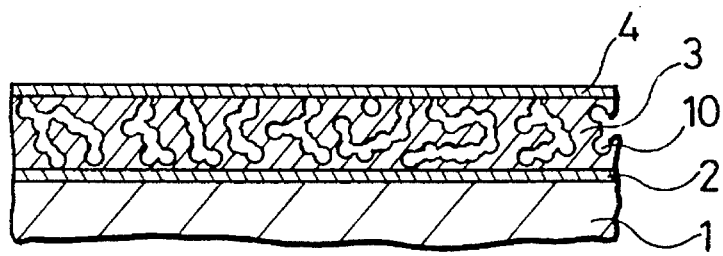

Thereafter, as illustrated in FIG. 2(d), a cap film 4 comprising $SiO_x$, $SiN_x$, or $SiO_xN_y$ and having a thickness of 0.1 micron or less is formed on the entire surface of the insulating film 3 in which the vacancies 10 are formed. The cap film 4 covers the vacancies on the surface of the insulating film 3 to flatten the surface of the insulating film 3 and mechanically reinforces the insulating film 3.

Figure 2E:
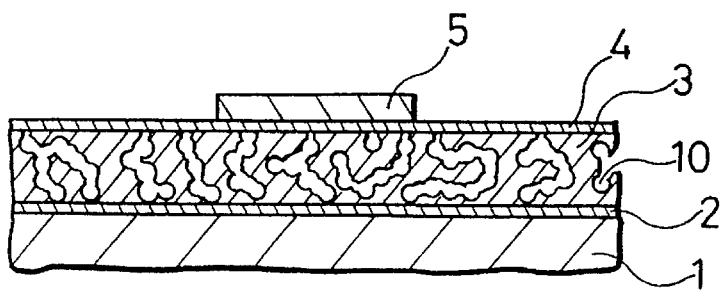

Then, a metal film is deposited on the cap film 4 by vapor deposition or the like and patterned to form the lower wiring 5 as shown in FIG. 2(e). Since the vacancies 10 on the surface of the insulating film 3 are covered with the cap film 4, the surface of the wafer is flat, whereby the patterning of the lower wiring 5 is easily carried out.

After the formation of the lower wiring 5, the third cap film 6, the second insulating film 7, the fourth cap film 8, and the upper wiring 9 are formed in accordance with the same steps as FIGS. 2(a) and 2(f), resulting in the multilayer interconnection structure shown in FIG. 1.

According to the first embodiment of the present invention, the main material of the interlayer insulating film, in which particles comprising a different material from the main material are mixed, is applied to the surface of the wafer on which the interlayer insulating film is to be formed and then the applied material is solidified. Thereafter, the particles are selectively etched away by an etchant that etches the particles but does not etch the main material. In this way, the interlayer insulating film, in which vacancies are evenly scattered, is formed.

Figure 3:
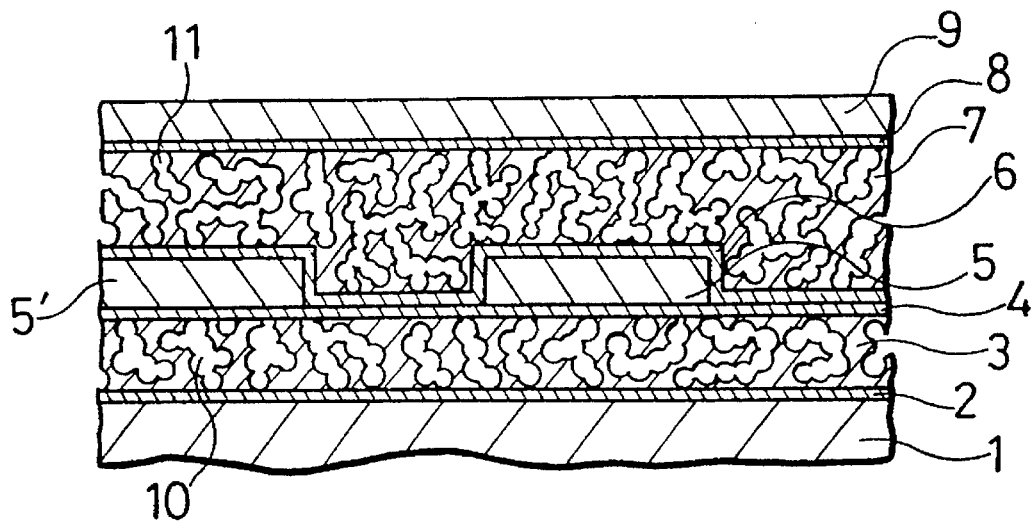
FIG. 3 is a cross-sectional view for explaining effects of an interlayer insulating film of the semiconductor integrated circuit of FIG. 1.

A description is given of effects of the interlayer insulating film in accordance with the first embodiment. In FIG. 3, the interlayer insulating films 3 and 7 include vacancies 10 and 11 evenly scattered in these films, respectively. The vacancies are identical to the air gaps and have a dielectric constant smaller than that of the main material of the interlayer insulating film. Therefore, the effective dielectric constant of the whole insulating film including the vacancies is smaller than that of the conventional insulating film including no vacancies. Accordingly, when the insulating film is inserted between wirings, the capacitance between the wirings is reduced, thereby increasing the operating speed of the device. In addition, since the vacancies are evenly scattered throughout the insulating film, the vacancies are present not only between the upper and lower wiring 9 and 5 but also between adjacent wirings 5 and 5' shown in FIG. 3. Therefore, capacitance between the upper and lower wirings and capacitance between the adjacent wirings are reduced.

In addition, since the vacancies are formed by etching the particles each having a diameter of submicron order, the diameter of the vacancy on the surface of the insulating film is of submicron order. Therefore, the wiring disposed on the insulating film does not fall into the vacancy, preventing deformation and breaking of the wiring. In addition, since the vacancies are formed by etching the particles each having a diameter of submicron order, each vacancy is very small, resulting in sufficient strength in the insulating film supporting the wiring.

Functions of the cap films 2, 4, 6, and 8 will be described in detail.

During the formation of the vacancies 10 in the first interlayer insulating film 3, the first cap film 2 prevents the etchant from etching the substrate 1 and the electrodes or the like on the substrate 1. The first cap film 2 is only 0.1 micron thick or less. If it is too thick, the capacitance of the cap film 2 increases and the capacitance reducing effect due to the vacancies is lessened. In addition, if an etchant that does not etch the substrate and the electrodes or the like on the substrate is used, the cap film 2 can be dispensed with.

The second and fourth cap films 4 and 8 cover the vacancies 10 on the surface of the first insulating film 3 and the vacancies 11 on the surface of the second insulating film 7, respectively, whereby formation of the lower and upper wirings 5 and 9 is simplified and the mechanical strength of each insulating film is increased. The second and fourth cap films 4 and 8 are as thin as or thinner than 0.1 micron, for the same reason as the first cap film 2. Since each vacancy is very small as described above, the formation of each wiring is relatively easy and each insulating film has a sufficient mechanical strength even if the second and fourth cap films 4 and 8 are absent. Therefore, the cap films 4 and 8 are not necessarily required. However, when the cap films 4 and 8 are present, deformation and breaking of the wirings 5 and 9 are completely avoided and the strength of the insulating films 3 and 7 supporting the wirings is further increased.

The third cap film 6 prevents the etchant from etching the lower wiring when the vacancies 11 in the second insulating film 7 are formed by etching. If an etchant that does not etch the lower wiring is used, the cap film 6 may be dispensed with. For example, when gold is used for the lower wiring 5 and particles comprising aluminum are etched away by NaOH or KOH, since NaOH and KOH do not etch gold, the cap film 6 may be absent. However, if both of the second and third cap films 4 and 6 are absent, the etchant used in the formation of the vacancies 11 in the second insulating film unfavorably enters the vacancies 10 in the first insulating film 3. At this time, it is difficult to remove the etchant in the vacancies 10. Accordingly, in order to improve work efficiency and reliability, it is to be desired that either the second cap film 4 or the third cap film 6 should be present.

While in the above-described embodiment the $SiO_2$ series vitreous material which vitrifies at a low temperature is used as a material of the first and second insulating films 3 and 7, an organic material of (polytetrafluoroethylene), polyimide resin, or polyamide resin may be used. When these materials are used, the insulating film is hardened at 300° to 400° C., which is lower than the temperature at which the $SiO_2$ series material vitrifies. Therefore, these materials are effective when the temperature at which the performance of the semiconductor device deteriorates is low.

While in the above-described embodiment the particles, which are mixed into the $SiO_2$ series vitreous material, comprise aluminum, the particles may comprise any material so long as it is etched by an etchant that does not etch the main material of the insulating film. For example, if the particles comprise tantalum (Ta), the particles can be selectively etched by an alkaline etchant, such as NaOH or KOH. For example, when the above-described organic material of Teflon, polyimide resin, or polyamide resin is used as the main material of the insulating film, particles comprising $SiO_2$ may be mixed into the main material and selectively etched using hydrofluoric acid as an etchant.

Figure 4:
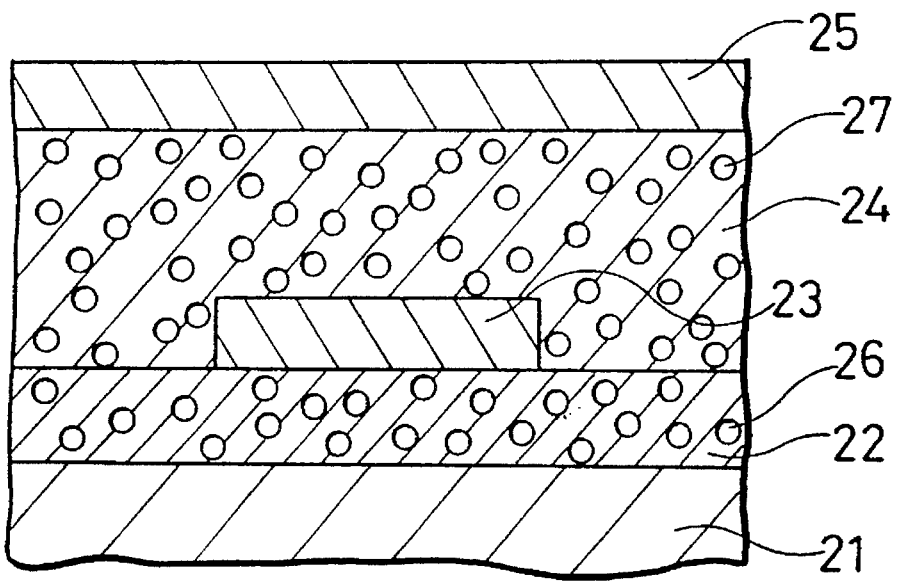
FIG. 4 is a cross-sectional view illustrating a multilayer interconnection of a semiconductor integrated circuit in accordance with a second embodiment of the present invention.
Figure 5:
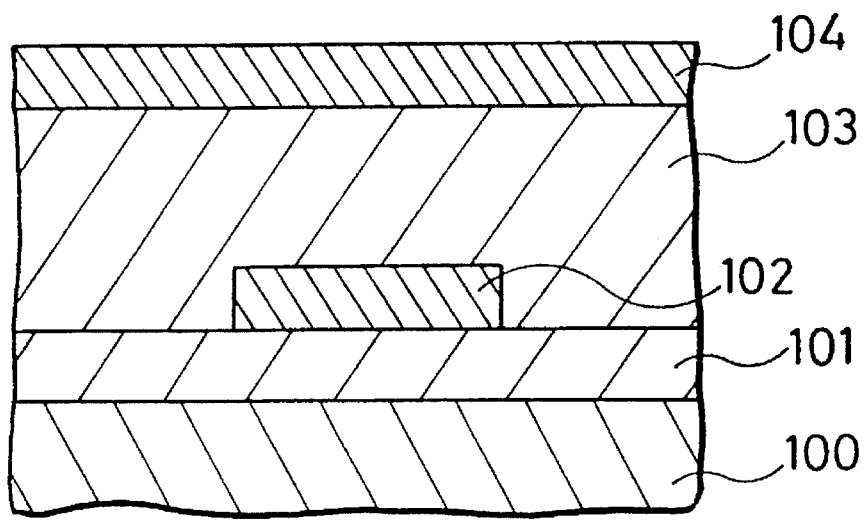
FIG. 5 is a cross-sectional view illustrating a multilayer interconnection of a semiconductor integrated circuit in accordance with the prior art.
Figure 6:
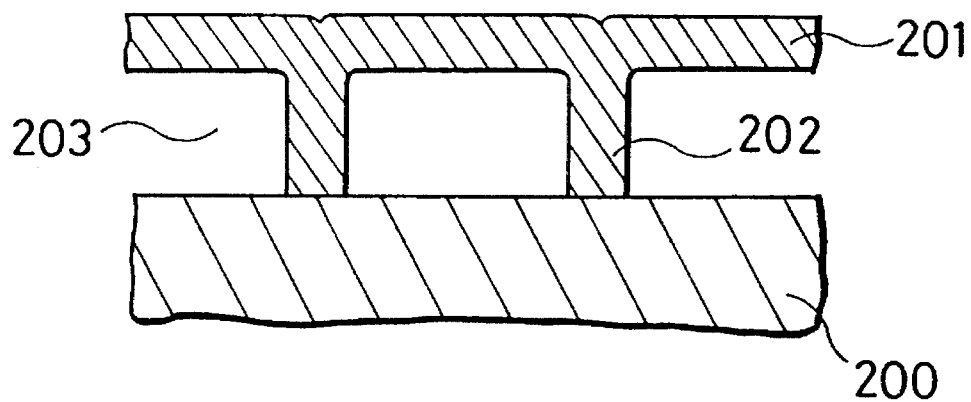
FIG. 6 is a cross-sectional view illustrating an air-bridge structure of a semiconductor integrated circuit in accordance with the prior art.
Figure 7A:
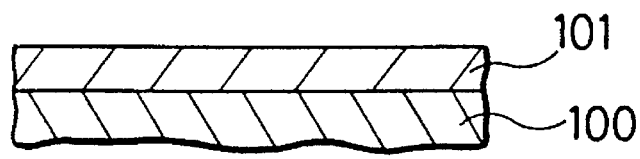
FIGS. 7(a)–7(d) are cross-sectional views of steps in a method for producing the structure of FIG. 5.
Figure 7B:
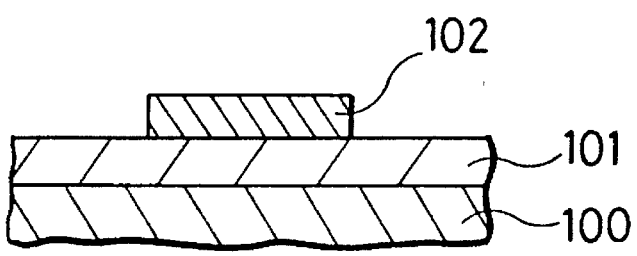
Figure 7C:
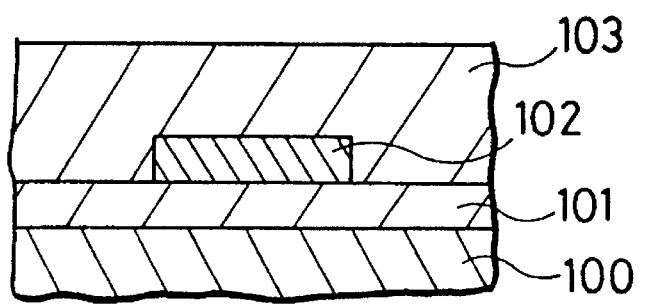
Figure 7D:
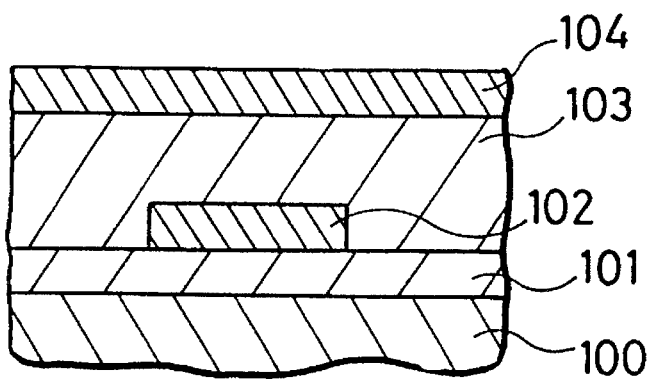
Figure 8A:
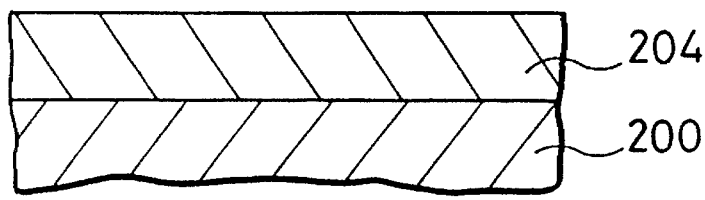
FIGS. 8(a)–8(d) are cross-sectional views of steps in a method for producing the structure of FIG. 6.
Figure 8B:
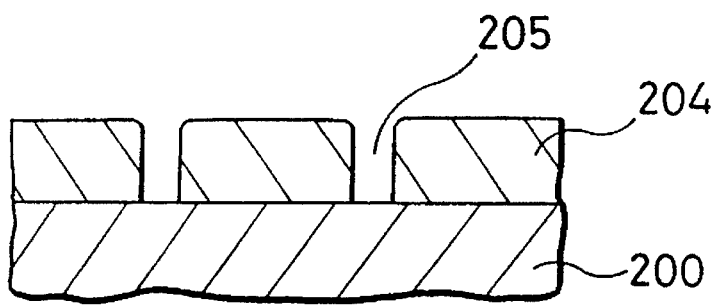
Figure 8C:
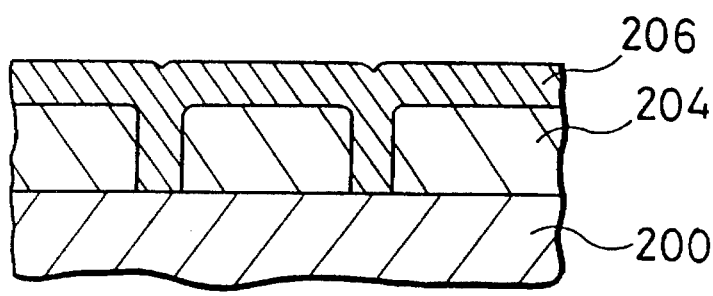
Figure 8D:
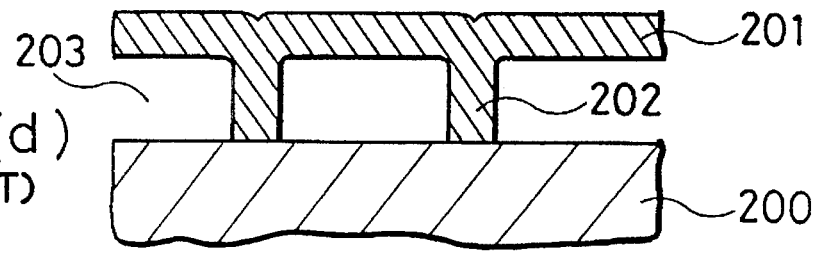
Figure 9:
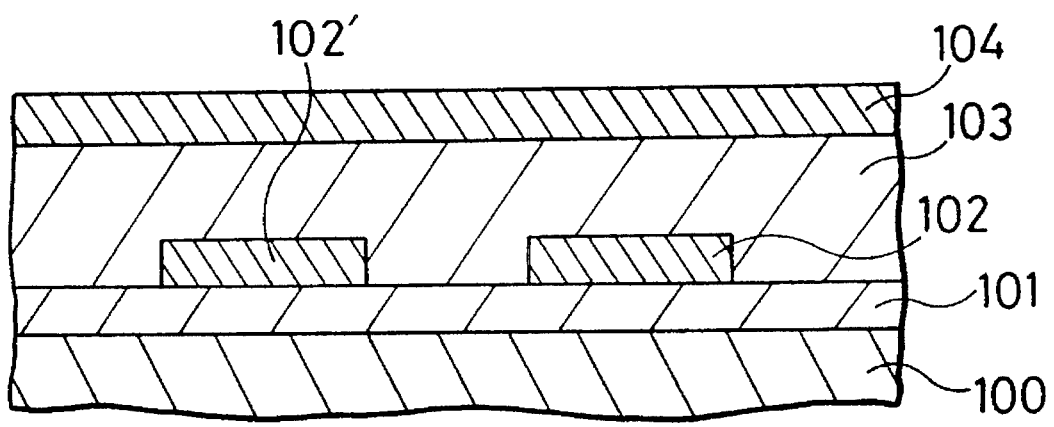
FIG. 9 is a cross-sectional view for explaining problems of the structure of FIG. 5.

FIG. 4 is a cross-sectional view showing a multilayer interconnection of a semiconductor integrated circuit in accordance with a second embodiment of the present invention. In FIG. 4, reference numeral 21 designates a semiconductor substrate. A first interlayer insulating film 22 is disposed on the substrate 1 and a lower wiring 23 is disposed on the first insulating film 22. A second interlayer insulating film 24 is disposed on the lower wiring 23 and the first insulating film 22. An upper wiring 25 is disposed on the second insulating film 24. Bubbles 26 and 27 are evenly scattered in the first and second insulating films 22 and 24, respectively.

The insulating films 22 and 24 of this second embodiment have the same effects as the insulating films 3 and 7 of the first embodiment. That is, in the structure of FIG. 4, the insulating films 22 and 24 include the bubbles 26 and 27, respectively, and the bubbles are identical to the air gaps and have a dielectric constant lower than the dielectric constant of the main material of the insulating film. Therefore, the effective dielectric constant of the whole insulating film including the bubbles is smaller than the dielectric constant of an insulating film including no bubbles. Accordingly, when the insulating film is inserted between the wirings 23 and 25, capacitance between the wirings is reduced, whereby operating speed of the device is increased. In addition, since the bubbles are evenly scattered in all over the insulating film like the vacancies of the first embodiment, capacitance not only between the upper and lower wirings but also between adjacent wirings is reduced.

In this second embodiment, if the diameter of each bubble is of submicron order, the strength of the insulating film supporting the wiring is increased.

According to an aspect of the present invention, a semiconductor integrated circuit includes vacancies or bubbles evenly scattered in an interlayer insulating film. Therefore, the effective dielectric constant of the insulating film is reduced, whereby capacitance between upper and lower wirings and capacitance between adjacent wirings are reduced, resulting in a high speed semiconductor device.

According to another aspect of the present invention, a main material of an insulating film, including particles comprising a different material from the main material, is applied to a surface of a wafer where the insulating film is to be formed. Then, the main material is solidified and the particles are selectively etched with an etchant that etches the particles but does not etch the main material to form the insulating film in which vacancies are evenly scattered. In this way, an insulating film having a low effective dielectric constant is formed in a simple process, resulting in a high speed semiconductor device having a small capacitance between wirings.

As is evident from the foregoing description, according to the present invention, a semiconductor integrated circuit includes vacancies or bubbles evenly scattered in an interlayer insulating film. Therefore, the effective dielectric constant of the insulating film is reduced, whereby capacitance between upper and lower wirings and capacitance between adjacent wirings are reduced, resulting in a high speed semiconductor device.

In addition, according to the present invention, a main material of an insulating film, including particles comprising a different material from the main material, is applied to a surface of a wafer where the insulating film is to be formed.

Then, the main material is solidified and the particles are selectively etched with an etchant that etches the particles but does not etch the main material to form an insulating film in which vacancies are evenly scattered. Therefore, an insulating film having a low effective dielectric constant is formed in a simple process, resulting in a high speed semiconductor device having a small capacitance between wirings.

What is claimed is:

1. A method for producing an interlayer insulating film comprising:

applying a mixture of a main constituent of an interlayer insulating film and solid particles comprising a material different from the main constituent to a wafer where the interlayer insulating film is to be formed and solidifying the main constituent; and selectively etching the solid particles with an etchant that etches the solid particles but does not etch the main constituent.

2. The method of claim 1 wherein the main constituent is a vitreous material including $SiO_2$ wherein solidifying the main constituent comprises vitrification of the main constituent.

3. The method of claim 2 wherein the solid particles are selected from the group consisting of aluminum and tantalum and the etchant is selected from the group consisting of NaOH and KOH.

4. The method of claim 1 wherein the main constituent is an organic material chosen from the group consisting of polytetrafluoroethylene, polyimide resin, and polyamide resin.

5. The method of claim 1 including forming a first insulating film that is not etched by the etchant on the wafer where the interlayer insulating film is to be disposed and thereafter applying the mixture to the first insulating film.

* * * * *